(12) United States Patent
Kim et al.

(10) Patent No.: US 6,310,503 B1
(45) Date of Patent: Oct. 30, 2001

(54) DELAY CIRCUIT HAVING A CONSTANT DELAY TIME

(75) Inventors: Saeng Hwan Kim, Suwon-shi; Hyun Sung Hong, Seoul; Hack Soo Kim, Yicheon-shi, all of (KR)

(73) Assignee: Hyundai Electronics Industries Co., Ltd., Gyunggi-do (KR)

( * ) Notice: Subject to any disclaimer, the term of this patent is extended or adjusted under 35 U.S.C. 154(b) by 0 days.

(21) Appl. No.: 09/342,603

(22) Filed: Jun. 29, 1999

(30) Foreign Application Priority Data

Jun. 30, 1998 (KR) .................................................. 98-26206

(51) Int. Cl.[7] .................................................. H03H 11/26
(52) U.S. Cl. ........................................... 327/261; 327/284
(58) Field of Search .................................... 327/284, 285, 327/261, 108, 111

(56) References Cited

U.S. PATENT DOCUMENTS 5,397,967 * 3/1995 Carobolante et al. ............... 318/254
5,617,051 * 4/1997 Bingham .............................. 327/310
5,748,542 * 5/1998 Zheng et al. ........................ 365/194

FOREIGN PATENT DOCUMENTS 8-83487   3/1996 (JP) .

* cited by examiner

*Primary Examiner*—Toan Tran
*Assistant Examiner*—Cassandra Cox
(74) *Attorney, Agent, or Firm*—Crompton, Seager & Tufte, LLC

(57) ABSTRACT

The present invention discloses a delay circuit having a constant delay time. The delay circuit comprises an electric wire for transmitting a driving signal from a driver; a capacitor connected between said electric wire and ground, and for delaying transmission of said driving signal; and a current source connected to said electric wire and capacitor in parallel, and for keeping an amount of an electric current applied to said capacitor constant when a signal applied to said capacitor is varied.

21 Claims, 8 Drawing Sheets

DELAY CIRCUIT HAVING A CONSTANT DELAY TIME

BACKGROUND OF THE INVENTION

1. Field of the Invention

The present invention relates to an electronic circuit, and more particularly to a circuit having a constant delay time regardless of the variation in a driving voltage.

2. Description of the Prior Art

Generally, a certain time is required when an electronic signal is transmitted, which is typically the time that the signal is delayed.

FIG. 1 is a circuit diagram of a conventional delay circuit. As shown in this drawing, the conventional delay circuit comprises an inverter 10 for inverting an input signal IN, a capacitor 11 connected to an output terminal of the inverter 10 in parallel and an inverter 12 for inverting the output signal from the inverter 10 so as to generate a delayed signal OUT.

The delay circuit of FIG. 1 is adapted to delay the input signal IN using a RC delay according to the turn-on resistance of an electric wire and a capacitance of the capacitor 11 wherein the delay time is determined mainly by the capacitance thereof.

If a voltage applied to the capacitor 11 is varied, an amount of current flowing through the output terminal of the inverter 10 and the capacitor 11 is varied, too. Accordingly, the time for charging the capacitor 11 becomes diverse resulting in a variation in the delay time. Typically, the current is proportional to a square of driving voltage and the capacitance to the driving voltage. Thus, the driving voltage should be maintained constantly to keep the delay time fixed, which is difficult in actuality. As a result, there is a need for a delay circuit which can have a constant delay time regardless of the variation in the driving voltage.

SUMMARY OF THE INVENTION

Therefore, it is an object of the present invention to overcome the above problems encountered in prior arts and to provide a circuit having a constant delay time regardless of variation of a driving voltage.

To accomplish the above mentioned object, the present invention provides a circuit having a constant delay time comprising: an electric wire for transmitting a driving signal from a driver; a capacitor connected between said electric wire and ground, and for delaying transmission of said driving signal; and a current source connected to said electric wire and capacitor in parallel, and for keeping an amount of an electric current applied to said capacitor constant when a signal applied to said capacitor is varied.

The present invention further provides a circuit having a constant delay time comprising: an electric wire for transmitting a signal; a capacitor connected to said electric wire in parallel and for delaying the transmission of said signal; a current controlling transistor connected to said capacitor in parallel, and coupled between said electric wire and the ground; and a reference voltage generator at its output terminal connected to a gate of said current controlling transistor, and for varying an amount of an electric current flowing through said current controlling transistor when a level of a voltage applied to said capacitor is changed, thereby keeping an amount of an electric current flowing through said capacitor constant.

The present invention further provides a circuit having a constant delay time comprising: an inverter for inverting an input signal to generate an output signal; an electric wire for transmitting said output signal; a capacitor connected between said electric wire and a terminal of the source voltage, and for delaying the transmission of said output signal; a first current controlling transistor connected to said capacitor in parallel, and connected between said electric wire and a terminal of the voltage source; first switching means connected to a gate of said first current controlling transistor, and operated in response to a first control signal which is enabled when a level of a voltage applied to said capacitor varies, whereas it is disabled to turn off said first current controlling transistor when that of the voltage goes constant; and a first reference voltage generator at its output terminal connected to said first switching means, and for varying an amount of an electric current flowing through said first current controlling transistor when a level of a voltage applied to said capacitor is changed, thereby keeping an amount of an electric current flowing through said capacitor constant.

The present invention further provides a circuit having a constant delay time comprising: an inverter for inverting an input signal to generate an output signal; an electric wire for transmitting said output signal; a capacitor connected between said electric wire and the ground, and for delaying the transmission of said output signal; a first current controlling transistor connected to said capacitor in parallel, and connected between said electric wire and the ground; first switching means connected to a gate of said first current controlling transistor, and for increasing an amount of the electric current flowing through said first current controlling transistor when a voltage applied to said capacitor is increased, thereby causing the amount of the electric current flowing through said capacitor to be kept constant; a second current controlling transistor connected between said electric wire and a terminal of the source voltage; and second switching means connected to a gate of said second current controlling transistor, and for decreasing an amount of the electric current flowing through said second current controlling transistor when a voltage applied to said capacitor is decreased, thereby causing the amount of the electric current flowing through said capacitor to be kept constant.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

The application of the preferred embodiments of the present invention is best understood with reference to the accompanying drawings.

Figure 1:
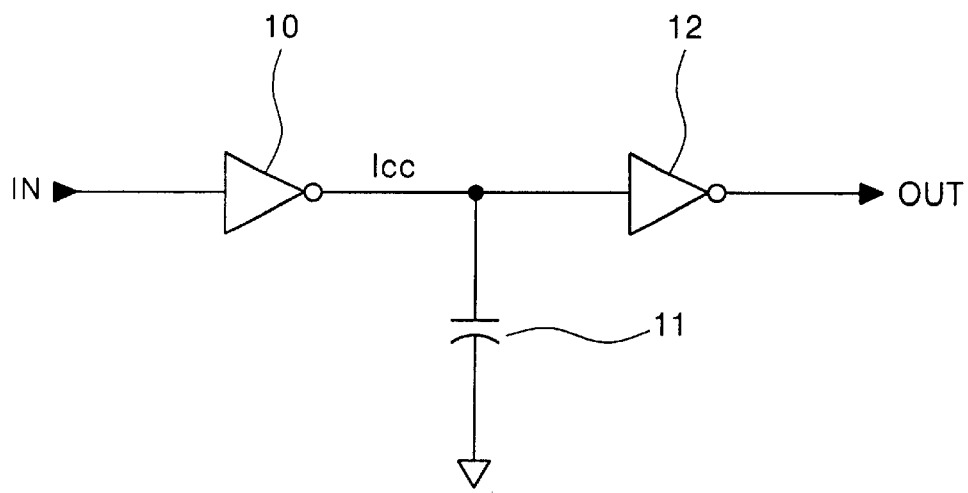
FIG. 1 is a circuit diagram of a conventional delay circuit.
Figure 2:
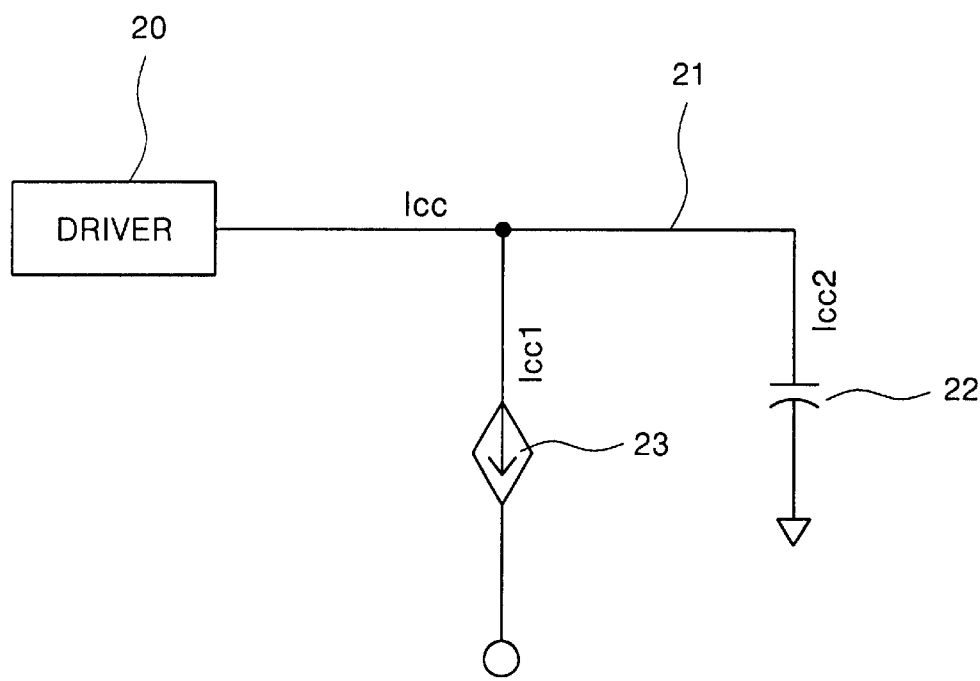
FIG. 2 is a circuit diagram of a delay circuit in accordance with a first embodiment of the present invention.

FIG. 2 is a circuit diagram of a delay circuit in accordance with a first embodiment of the present invention.

With reference to this drawing, the delay circuit comprises an electric wire 21 for transmitting a driving signal from a driver 20, a capacitor 22 connected to the electric wire 21, and a current source 23 connected thereto in parallel.

The driving signal is transmitted through the electric wire 21. The capacitor 22 is connected between the electric wire 21 and the ground, and delays the transmission of the driving signal.

The current source 23 is connected to the electric wire 21 and capacitor 22 in parallel, and keeps an amount of an electric current Icc2 applied to the capacitor 22 constant when a signal applied to the capacitor 22 is varied. The current source 23 is provided with a voltage controlled current source for controlling an amount of an output current Icc1 resulted from a supplied voltage.

Figure 3:
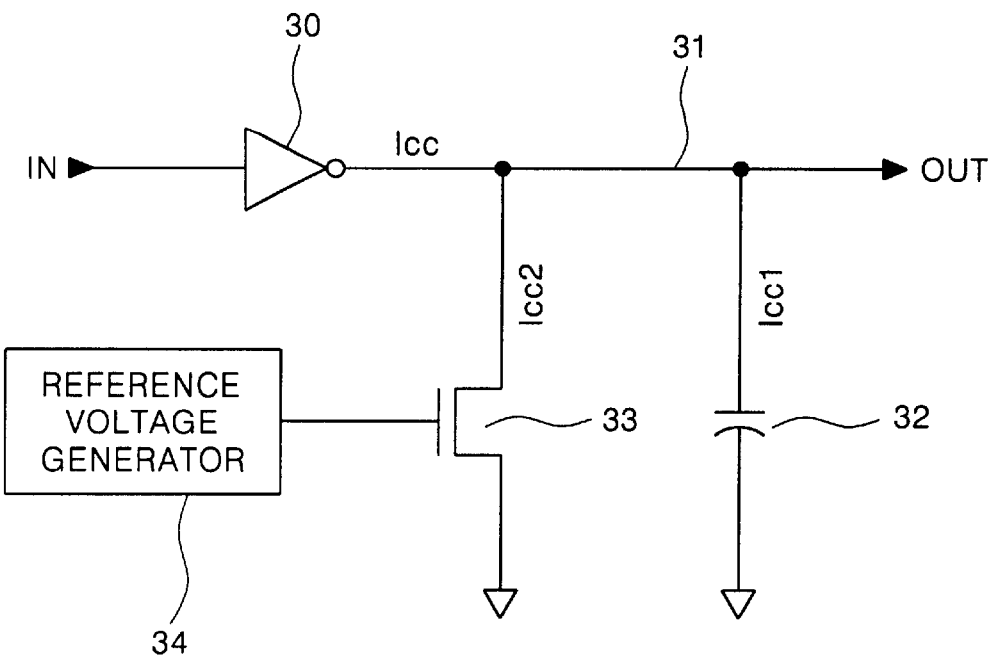
FIG. 3 is a circuit diagram of a delay circuit in accordance with a second embodiment of the present invention.

FIG. 3 is a circuit diagram of a delay circuit in accordance with a second embodiment of the present invention.

With reference to this drawing, the delay circuit comprises an inverter 30 for inverting an input signal IN to generate an output signal OUT, an electric wire 31 for transmitting a signal from the inverter 30, a capacitor 32 which is connected to the electric wire 31 in parallel and delays the transmission of the output signal OUT. The delay circuit of FIG. 3 further comprises a N-channel MOS transistor 33 and a reference voltage generator 34.

The N-channel MOS transistor 33 is connected to the capacitor 32 in parallel, and coupled between the electric wire 31 and the ground.

The reference voltage generator 34 is at its output terminal connected to a gate of the N-channel MOS transistor 33, and adapted to increase a voltage applied to the gate thereof to increase an amount of the electric current Icc2 flowing through the N-channel MOS transistor 33 when a level of a driving voltage, that is, the input signal IN goes up and thereby an amount of the electric current Icc1 applied to the capacitor 32 is increased. On the contrary, the reference voltage generator 34 decrease the voltage applied thereto in order to reduce the amount thereof when the level of the input signal IN goes down and thereby the amount thereof is decreased.

Figure 4:
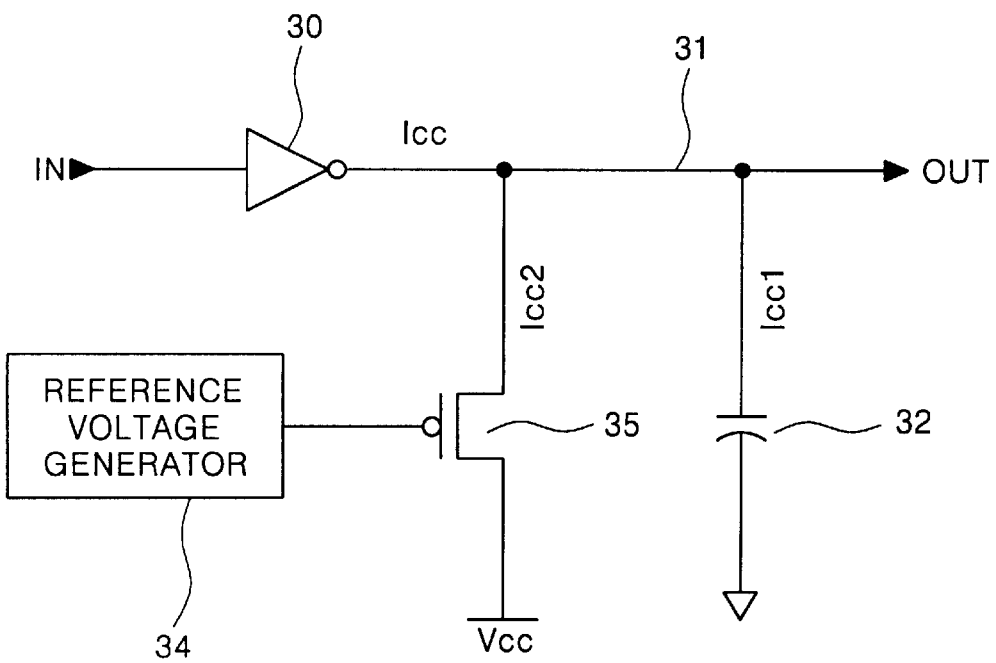
FIG. 4 is a circuit diagram of a delay circuit in accordance with a third embodiment of the present invention.

FIG. 4 is a circuit diagram of a delay circuit in accordance with a third embodiment of the present invention.

The delay circuit of this drawing is the same as that of FIG. 3 in its construction except that the N-channel MOS transistor 33 of FIG. 3 is replaced with a P-channel MOS transistor 35 at its source supplied with a source voltage Vcc.

Figure 5:
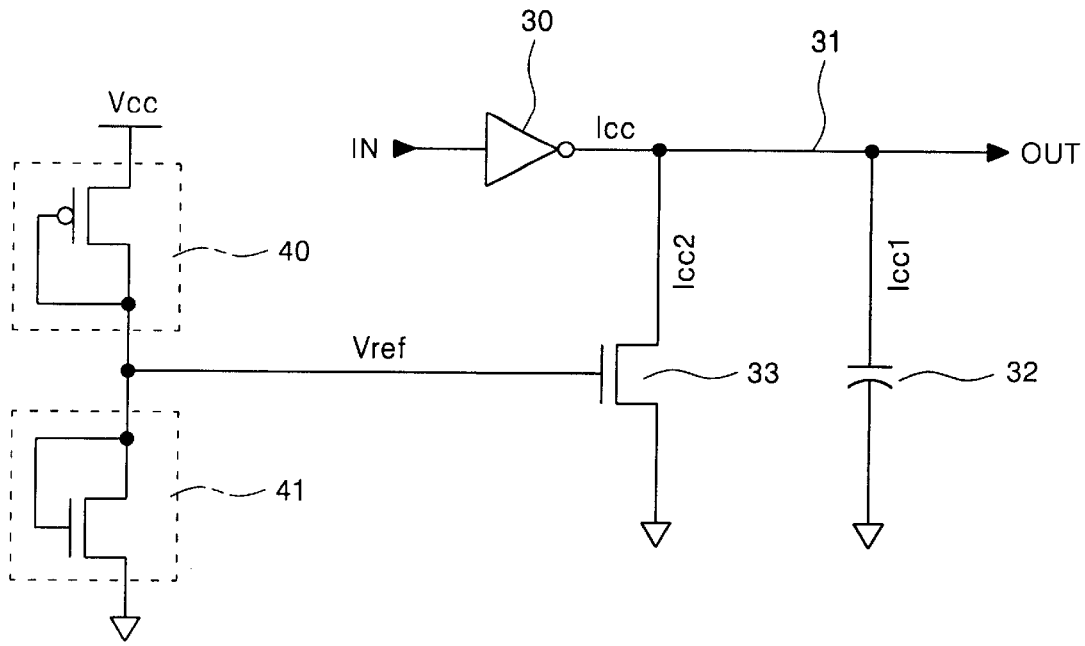
FIG. 5 is a circuit diagram of a delay circuit in accordance with a fourth embodiment of the present invention.

FIG. 5 is a circuit diagram of a delay circuit in accordance with a fourth embodiment of the present invention.

The delay circuit of FIG. 5 is the same as that of FIG. 3 in its construction except that the reference voltage generator 34 is replaced with a P-channel MOS transistor 40 and N-channel MOS transistor 41. The P-channel MOS transistor 40 has its source supplied with the source voltage Vcc, and its gate and drain connected to the gate of the N-channel MOS transistor 33 in common. Further, The N-channel MOS transistor 41 has its drain and gate connected to the drain of the P-channel MOS transistor 40, and its source grounded. The P-channel MOS transistor 40 and N-channel MOS transistor 41 function as resistors.

Figure 6:
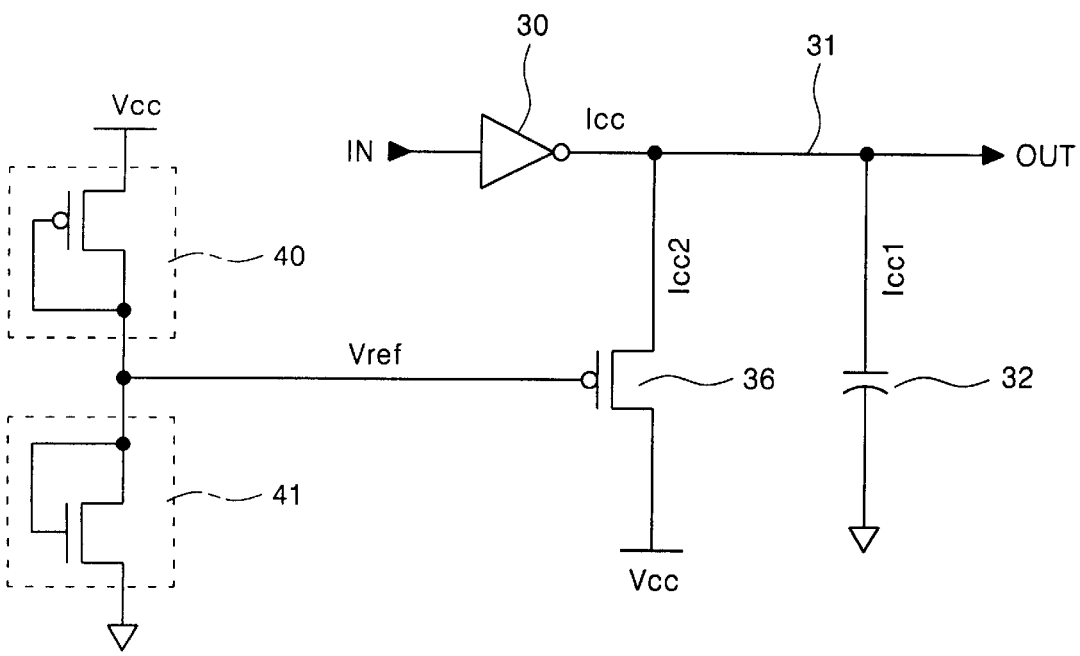
FIG. 6 is a circuit diagram of a delay circuit in accordance with a fifth embodiment of the present invention.

FIG. 6 is a circuit diagram of a delay circuit in accordance with a fifth embodiment of the present invention.

The delay circuit of FIG. 6 is the same as that of FIG. 5 in its construction except that the N-channel MOS transistor 33 is replaced with a P-channel MOS transistor 36 at its source supplied with the source voltage.

Figure 7:
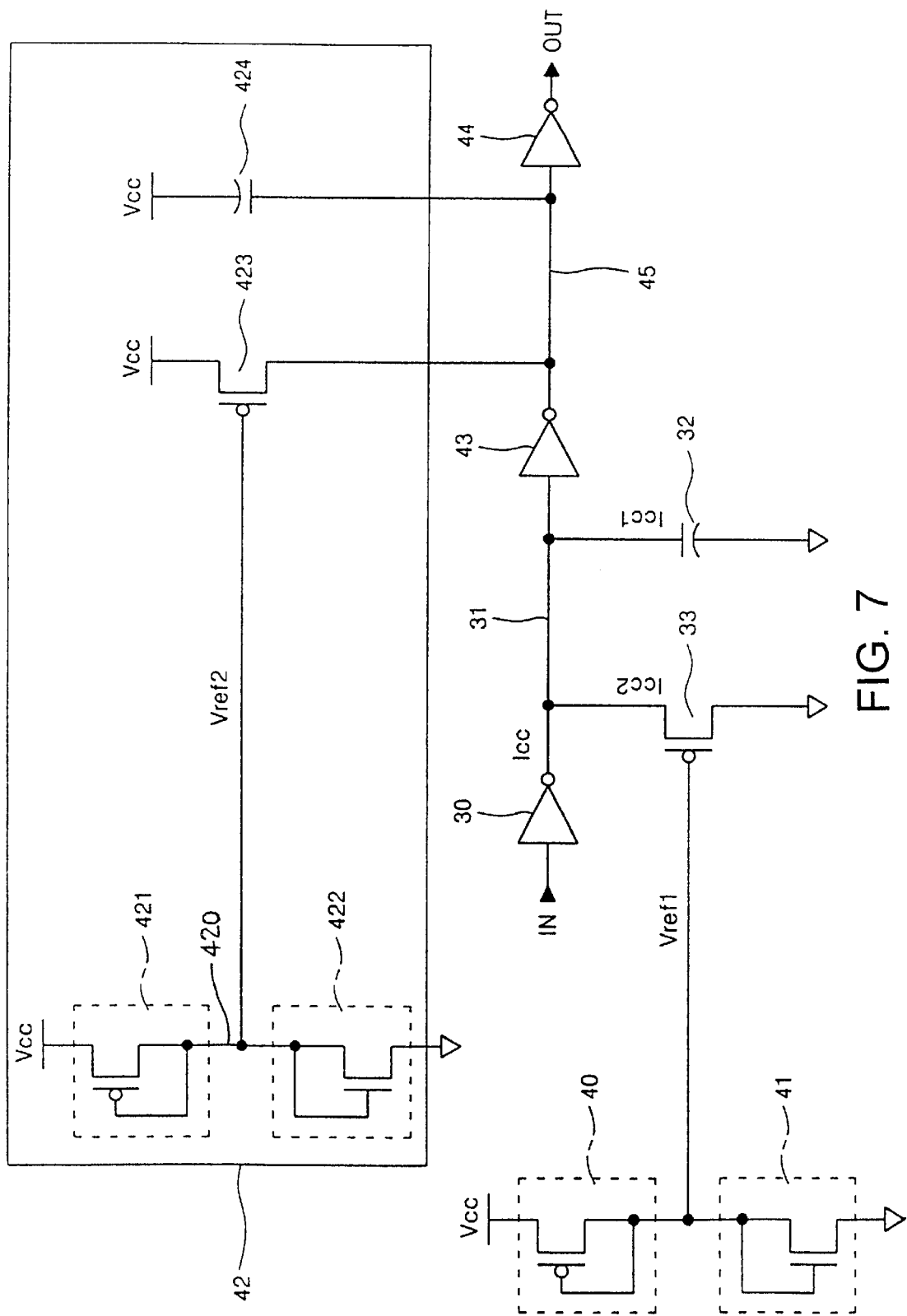
FIG. 7 is a circuit diagram of a delay circuit in accordance with a sixth embodiment of the present invention.

FIG. 7 is a circuit diagram of a delay circuit in accordance with a sixth embodiment of the present invention.

The delay circuit of FIG. 7 is the same as that of FIG. 6 in its construction except a control unit 42 and inverters 43 and 44.

The control unit 42 is connected between the electric wire 31 and a terminal of the source voltage Vcc, and adapted to supply the capacitor 32 with an electric current to keep an amount of the electric current flowing through the capacitor 32 constant when it is decreased.

The control unit 42 comprises a P-channel MOS transistor 421 connected between the terminal of the source voltage Vcc and an electric wire 420 and at its gate and drain connected to the electric wire 420, and a N-channel MOS transistor 422 at its gate and drain connected to the electric wire 420 in common and at its source grounded. The control unit 42 further comprises a P-channel MOS transistor 423 connected between the terminal of the source voltage Vcc and the electric wire 45 and its gate connected to the electric wire 420, and a capacitor 424 also connected between the terminal of the source voltage Vcc and the electric wire 45. The P-channel MOS transistor 421 and N-channel MOS transistor 422 function as resistors.

The inverters 43 and 44 are adapted to sequentially invert the signal from the inverter 30 in order to generate the signal OUT.

Figure 8:
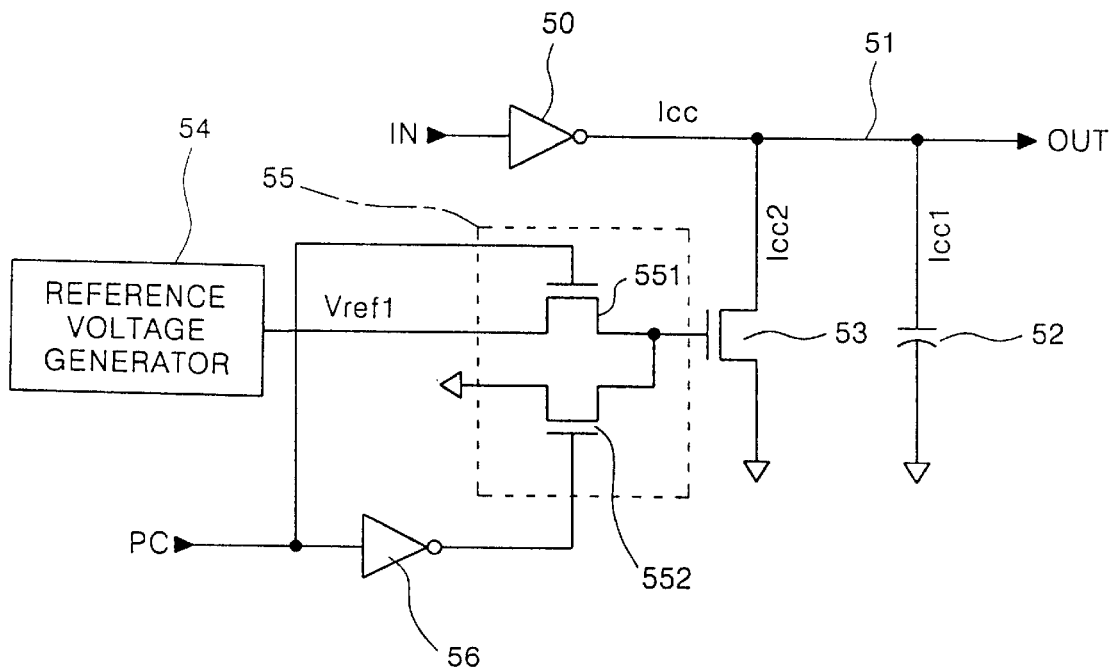
FIG. 8 is a circuit diagram of a delay circuit in accordance with a seventh embodiment of the present invention.

FIG. 8 is a circuit diagram of a delay circuit in accordance with a seventh embodiment of the present invention.

With reference to this drawing, the delay circuit comprises an inverter 50 for inverting the input signal IN to generate the output signal OUT, an electric wire 51 for transmitting a signal from the inverter 50, a capacitor 52 which is connected between the electric wire 51 and the ground, and delays the transmission of the output signal OUT. The delay circuit of FIG. 8 further comprises a N-channel MOS transistor 53 which is connected to the capacitor 52 in parallel and connected between the electric wire 51 and the ground, a reference voltage generator 54, and switching means 55.

The N-channel MOS transistor 53 is connected to the capacitor 52 in parallel, and coupled between the electric wire 51 and the ground.

The switching means 55 is connected to a gate of the N-channel MOS transistor 53, and operated in response to a control signal PC which is enabled when a level of a voltage applied to the capacitor 52 varies, whereas it is disabled to turn off the N-channel MOS transistor 53 when that of the voltage goes constant.

The switching means 55 further comprises a N-channel MOS transistor 551 which is connected between the reference voltage generator 54 and the gate of the N-channel MOS transistor 53, and gated by the control signal PC, and a N-channel MOS transistor 552 which is connected between the reference voltage generator 54 and the ground, and gated by an inverted signal of the control signal PC. The control signal PC is inverted at a inverter 56.

The reference voltage generator 54 is at its output terminal connected to the gate of the N-channel MOS transistor 53, and adapted to increase a voltage applied to the gate thereof via the switching means 55 to increase an amount of the electric current Icc2 flowing through the N-channel MOS transistor 53 when the input signal IN goes up and thereby an amount of the electric current Icc1 applied to the capacitor 52 is increased. On the contrary, the reference voltage generator 54 decrease the voltage applied thereto in order to reduce the amount thereof when the level of the input signal IN goes down and thereby the amount thereof is decreased. Thus, the amount of the electric current Icc1 flowing through the capacitor 52 can be kept constant.

Figure 9:
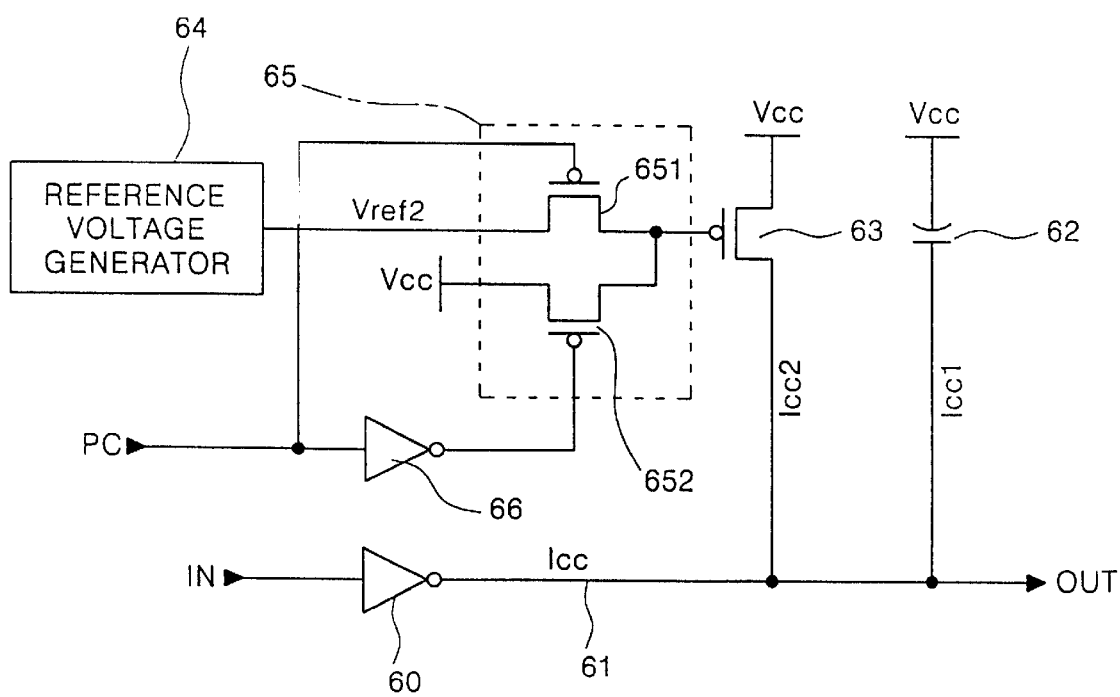
FIG. 9 is a circuit diagram of a delay circuit in accordance with a eighth embodiment of the present invention.

FIG. 9 is a circuit diagram of a delay circuit in accordance with a eighth embodiment of the present invention.

With reference to this drawing, the delay circuit comprises an inverter 60 for inverting the input signal IN to generate the output signal OUT, an electric wire 61 for transmitting a signal from the inverter 60, a capacitor 62 which is connected between the electric wire 61 and a terminal of the source voltage Vcc, and delays the transmission of the output signal OUT. The delay circuit of FIG. 9 further comprises a N-channel MOS transistor 63, a reference voltage generator 64, and switching means 65.

The N-channel MOS transistor 63 is connected to the capacitor 62 in parallel, and coupled between the electric wire 61 and the ground.

The switching means 65 is connected to a gate of the N-channel MOS transistor 63, and operated in response to a control signal PC which is enabled when a level of a voltage applied to the capacitor 62 varies, whereas it is disabled to turn off the N-channel MOS transistor 63 when that of the voltage goes constant.

The switching means 65 further comprises a N-channel MOS transistor 651 which is connected between the reference voltage generator 64 and the gate of the N-channel MOS transistor 63, and gated by the control signal PC, and a N-channel MOS transistor 652 which is connected between the reference voltage generator 64 and the ground, and gated by an inverted signal of the control signal PC. The control signal PC is inverted at a inverter 66.

The reference voltage generator 64 is at its output terminal connected to the gate of the N-channel MOS transistor 63, and adapted to increase a voltage applied to the gate thereof via the switching means 65 to increase an amount of the electric current Icc2 flowing through the N-channel MOS transistor 63 when the input signal IN goes up and thereby an amount of the electric current Icc1 applied to the capacitor 62 is increased. On the contrary, the reference voltage generator 64 decrease the voltage applied thereto in order to reduce the amount thereof when the level of the input signal IN goes down and thereby the amount thereof is decreased. Thus, the amount of the electric current Icc1 flowing through the capacitor 62 can be kept constant.

Figure 10:
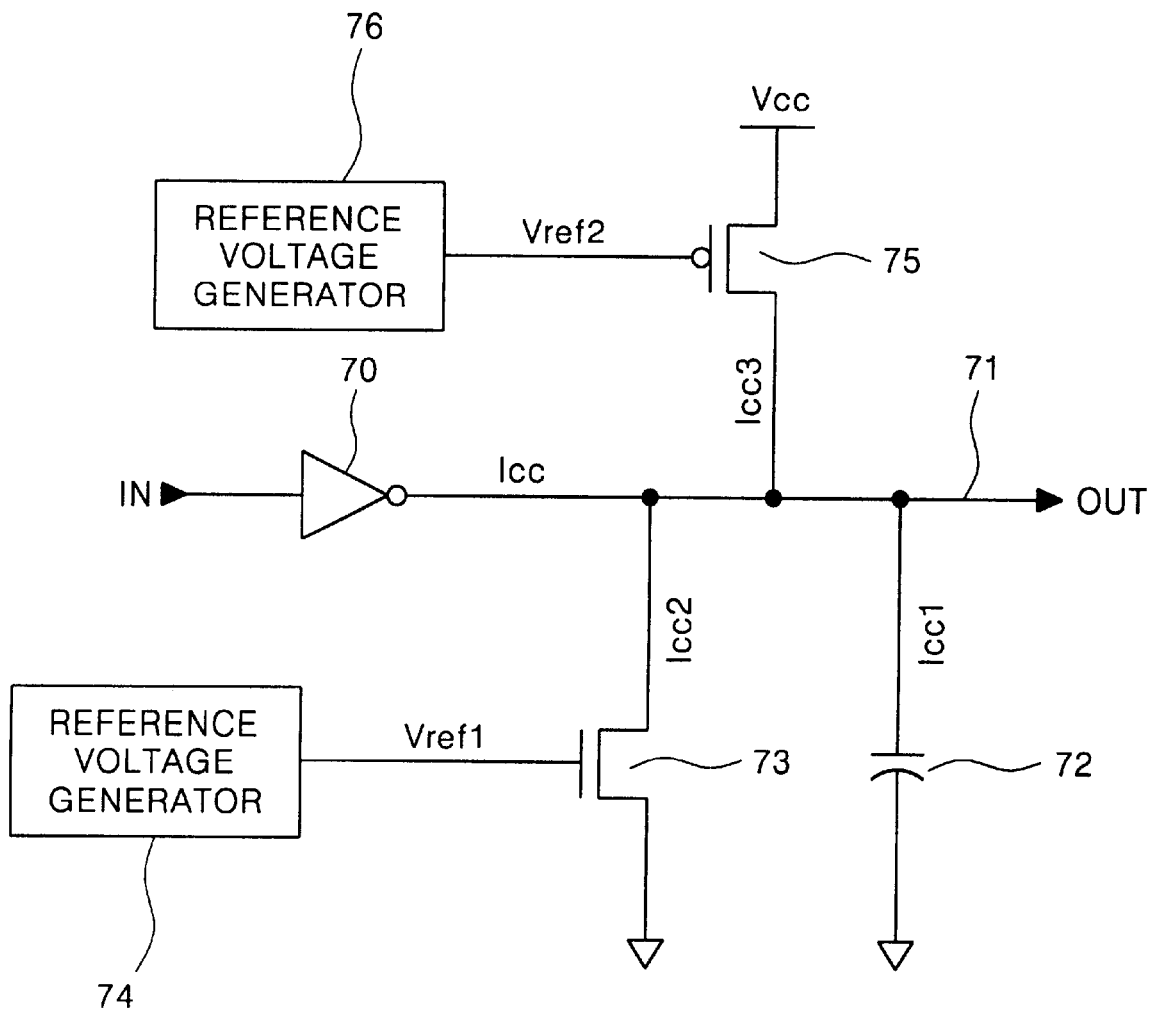
FIG. 10 is a circuit diagram of a delay circuit in accordance with a ninth embodiment of the present invention.

FIG. 10 is a circuit diagram of a delay circuit in accordance with a ninth embodiment of the present invention.

With reference to this drawing, the delay circuit comprises an inverter 70 for inverting the input signal IN to generate the output signal OUT, an electric wire 71 for transmitting a signal from the inverter 70, and a capacitor 72 which is connected between the electric wire 71 and the ground, and delays the transmission of the output signal OUT. The delay circuit of FIG. 10 further comprises a N-channel MOS transistor 73 which is coupled to the capacitor 72 in parallel and connected between the electric wire 71 and the ground, and a reference voltage generator 74 which is connected to a gate of the N-channel MOS transistor 73. The delay circuit thereof further comprises a N-channel MOS transistor 75 which is connected between the electric wire 71 and a terminal of the source voltage, and a reference voltage generator 76 which is connected to a gate of the N-channel MOS transistor 75.

The reference voltage generator 74 is adapted to increase a voltage applied to the gate of the N-channel MOS transistor 73 to increase an amount of the electric current flowing through the N-channel MOS transistor 73 when the input signal IN goes up and thereby an amount of the electric current Icc1 applied to the capacitor 72 is increased. On the contrary, the reference voltage generator 74 decrease the voltage applied thereto in order to reduce the amount thereof when the level of the input signal IN goes down and thereby the amount thereof is decreased. Thus, the amount of the electric current Icc1 flowing through the capacitor 72 can be kept constant.

In the same manner, the reference voltage generator 76 control a voltage applied to the gate of the N-channel MOS transistor 73 so that the amount of the electric current Icc1 flowing through the capacitor 72 can be kept constant.

Figure 11:
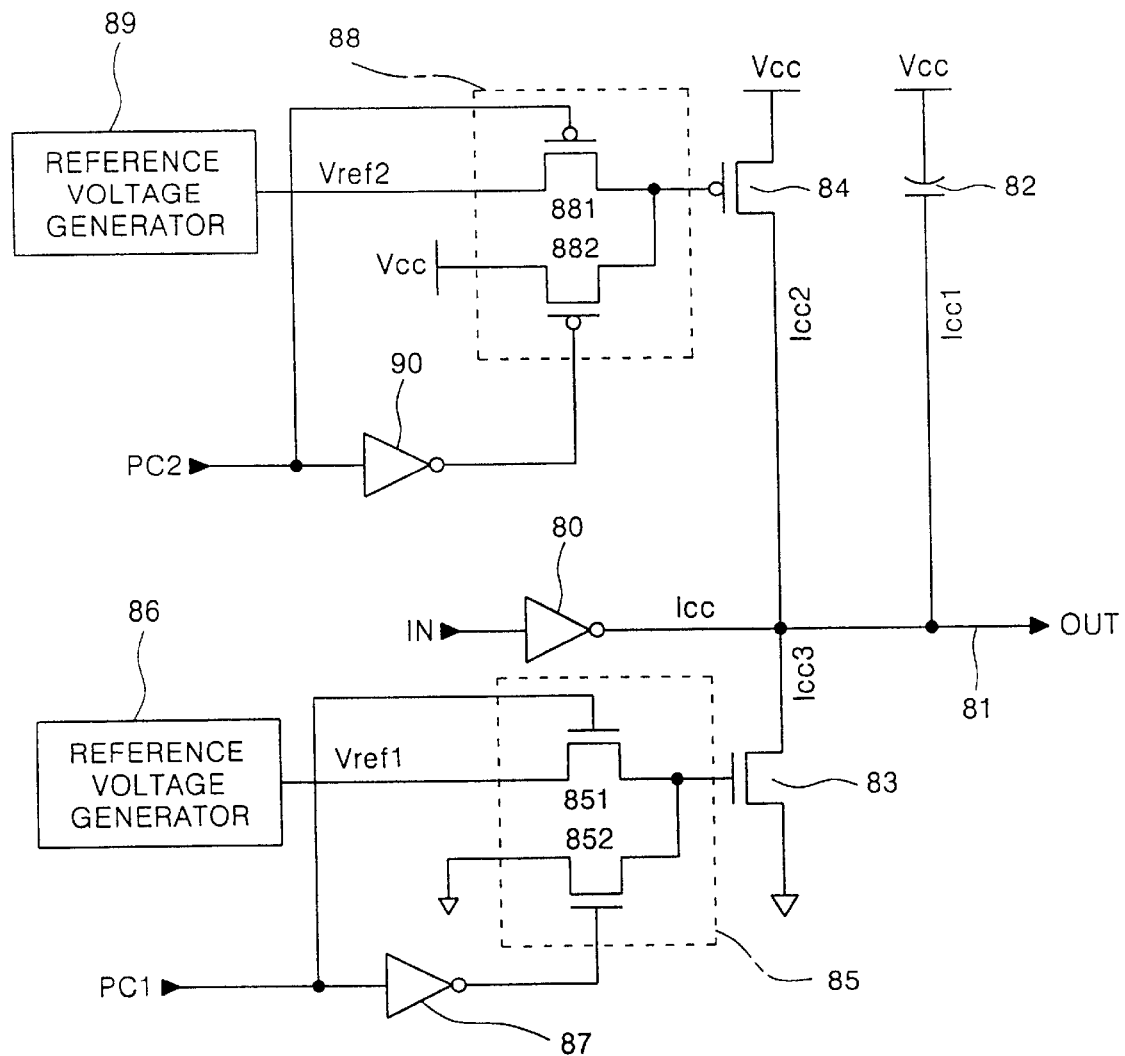
FIG. 11 is a circuit diagram of a delay circuit in accordance with a tenth embodiment of the present invention.

FIG. 11 is a circuit diagram of a delay circuit in accordance with a tenth embodiment of the present invention.

With reference to this drawing, the delay circuit comprises an inverter 80 for inverting the input signal IN to generate the output signal OUT, an electric wire 81 for transmitting a signal from the inverter 80, and a capacitor 82 which is connected between the electric wire 81 and a terminal of the voltage source Vcc, and delays the transmission of the output signal OUT. The delay circuit of FIG. 11 further comprises a N-channel MOS transistor 83 which is coupled to the capacitor 82 in parallel and connected between the electric wire 81 and the ground, and a P-channel MOS transistor 84 which is connected to the capacitor 82 in parallel and connected between the electric wire 81 and a terminal of the source voltage Vcc. The delay circuit thereof further comprises reference voltage generators 86 and 89, switching units 85 and 88, and inverters 87 and 90.

The switching unit 85 is connected to a gate of the N-channel MOS transistor 83, and operated in response to a control signal PC1 which is enabled when a level of a voltage applied to the capacitor 82 varies, whereas it is disabled to turn off the N-channel MOS transistor 83 when that of the voltage goes constant.

The switching unit 85 further comprises a N-channel MOS transistor 851 which is connected between the reference voltage generator 86 and the gate of the N-channel MOS transistor 83, and gated by the control signal PC, and a N-channel MOS transistor 852 which is connected between the ground and the gate of the N-channel MOS transistor 83, and gated by an inverted signal of the control signal PC1. The control signal PC1 is inverted at the inverter 87.

The reference voltage generator 86 is adapted to increase a voltage applied to the gate of the N-channel MOS transistor 83 to increase an amount of the electric current flowing through the N-channel MOS transistor 83 when the input signal IN goes up and thereby an amount of the electric current Icc1 applied to the capacitor 72 is increased. On the contrary, the reference voltage generator 86 decrease the voltage applied thereto in order to reduce the amount thereof when the level of the input signal IN goes down and thereby the amount thereof is decreased. Thus, the amount of the electric current Icc1 flowing through the capacitor 82 can be kept constant.

The switching unit 88 is connected to a gate of the P-channel MOS transistor 84, and operated in response to a control signal PC2 which is enabled when the level of the voltage applied to the capacitor 82 varies, whereas it is disabled to turn off the P-channel MOS transistor 84 when that of the voltage goes constant.

The switching unit 88 further comprises a P-channel MOS transistor 881 which is connected between the reference voltage generator 89 and the gate of the P-channel MOS transistor 84, and gated by the control signal PC2, and a P-channel MOS transistor 882 which is connected between a terminal of the source voltage Vcc and the gate of the P-channel MOS transistor 84, and gated by an inverted signal of the control signal PC2. The control signal PC2 is inverted at the inverter 90.

In the same manner, the reference voltage generator 76 control the voltage applied to the gate of the P-channel MOS transistor 84 when the voltage applied to the capacitor 82 increases such that it increases the amount of the current flowing though the P-channel MOS transistor 84, thereby causing the amount of the electric current Icc1 flowing through the capacitor 72 to be kept constant.

Figure 12:
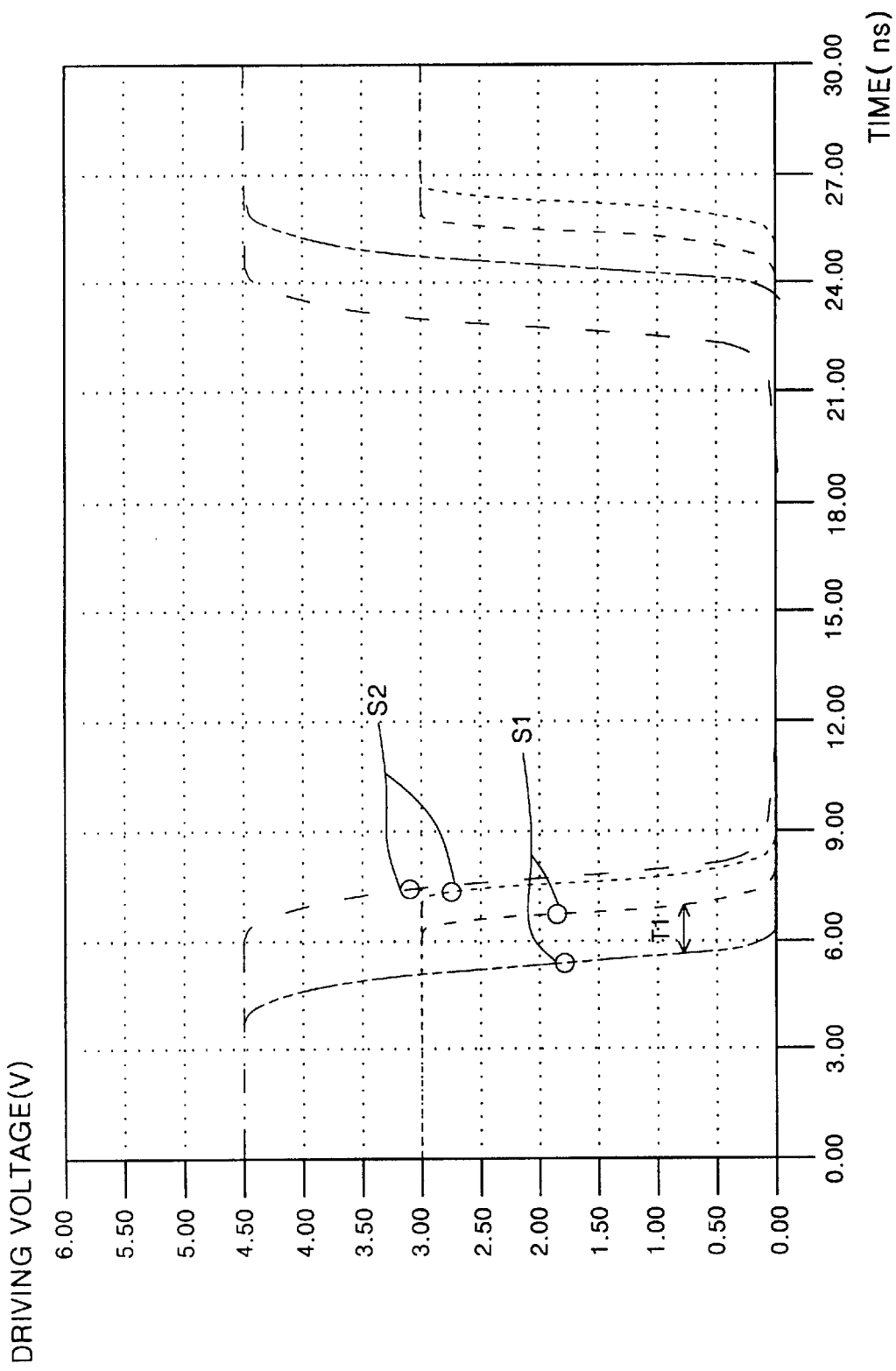
FIG. 12 is a graph showing the simulated results of the delay circuits in accordance with the embodiments of the present invention.

FIG. 12 is a graph showing the simulated results of the delay circuits in accordance with the embodiments of the present invention. As shown in this drawing, the output signal S1 of the conventional delay circuit makes a time difference by T1 according to variation of the driving voltage, whereas the output signal S2 of the present invention is kept constant regardless of the variation.

As described hereinbefore, the present invention can provide a delay circuit having a constant delay time regardless of the variation of the driving voltage.

What is claimed is:

1. A delay circuit having a constant delay time, comprising:
   an electric wire for transmitting a driving signal from a driver;
   a capacitor connected between said electric wire and ground, and for delaying transmission of said driving signal; and
   a current source connected to said electric wire and capacitor in parallel, and for keeping an amount of an electric current applied to said capacitor constant when a signal applied to said capacitor is varied, wherein said current source is provided with a voltage controlled current source for controlling an amount of an output current resulted from a supplied voltage.

2. A delay circuit having a constant delay time, comprising:
   an electric wire for transmitting a signal;
   a capacitor connected to said electric wire in parallel and for delaying the transmission of said signal;
   a current controlling transistor connected to said capacitor in parallel, and coupled between said electric wire and the ground; and
   a reference voltage generator at its output terminal connected to a gate of said current controlling transistor, and for varying an amount of an electric current flowing through said current controlling transistor when a level of a voltage applied to said capacitor is changed, thereby keeping an amount of an electric current flowing through said capacitor constant.

3. A delay circuit having a constant delay time as set forth in claim 2, wherein said current controlling transistor is provided with a N-channel MOS transistor.

4. A delay circuit having a constant delay time as set forth in claim 2, wherein said current controlling transistor is provided with a P-channel MOS transistor at its drain connected to said electric wire and at its source to a terminal of a source voltage.

5. A delay circuit having a constant delay time as set forth in claim 2, wherein said reference voltage generator further comprises:
   a first resistor at its one side supplied with a source voltage and at its the other side connected to the gate of said current controlling transistor; and
   a second resistor connected between said first resistor and the ground.

6. A delay circuit having a constant delay time as set forth in claim 5, wherein said first and second resistors are provided with a P-channel MOS transistor and a N-channel MOS transistor, respectively.

7. A delay circuit having a constant delay time as set forth in claim 2, further including control means connected between said electric wire and a terminal of a source voltage, and for supplying said capacitor with an electric current to keep an amount of the electric current flowing through said capacitor constant when it is decreased.

8. A delay circuit having a constant delay time as set forth in claim 7, wherein said control means further comprises:
   a first P-channel MOS transistor at its source supplied with the source voltage, and its gate connected to its drain;
   a N-channel MOS transistor at its drain and gate connected to the drain of said fist P-channel MOS transistor and at its source grounded; and
   a second P-channel MOS transistor at its gate connected to the drain of said first P-channel MOS transistor.

9. A delay circuit having a constant delay time as set forth in claim 2, further including switching means connected between said reference voltage generator and said current controlling transistor, and operated in response to a control signal which is enabled when a level of a voltage applied to said capacitor varies, whereas it is disabled to turn off said current controlling transistor when that of the voltage goes constant.

10. A delay circuit having a constant delay time as set forth in claim 2, wherein said switching means further comprises:
   a first transmission transistor connected between said reference voltage generator and the gate of said current controlling transistor, and gated by said control signal;
   a second transmission transistor connected between said reference voltage generator and ground, and gated by an inverted signal of said control signal.

11. A delay circuit having a constant delay time as set forth in claim 10, wherein said first and second transmission transistors are provided with a N-channel MOS transistor and P-channel MOS transistor, respectively.

12. A delay circuit having a constant delay time as set forth in claim 10, wherein said second transmission transistor is provided with a N-channel MOS transistor at its gate supplied with said control signal via an inverter.

13. A delay circuit having a constant delay time, comprising:

an inverter for inverting an input signal to generate an output signal;

an electric wire for transmitting said output signal; a capacitor connected between said electric wire and a terminal of the source voltage, and for delaying the transmission of said output signal;

a first current controlling transistor connected to said capacitor in parallel, and connected between said electric wire and a terminal of the voltage source;

first switching means connected to a gate of said first current controlling transistor, and operated in response to a first control signal which is enabled when a level of a voltage applied to said capacitor varies, whereas it is disabled to turn off said first current controlling transistor when that of the voltage goes constant; and a first reference voltage generator at its output terminal connected to said first switching means, and for varying an amount of an electric current flowing through said first current controlling transistor when a level of a voltage applied to said capacitor is changed, thereby keeping an amount of an electric current flowing through said capacitor constant.

14. A delay circuit having a constant delay time as set forth in claim 13, wherein said first current controlling transistor is provided with a P-channel MOS transistor.

15. A delay circuit having a constant delay time as set forth in claim 13, wherein said first switching means further comprises:

a first P-channel MOS transistor connected between said first reference voltage generator and the gate of said first current controlling transistor, and gated by said first control signal; and a second P-channel MOS transistor connected between said first reference voltage generator and a terminal of the source voltage, and gated by an inverted signal of said first control signal.

16. A delay circuit having a constant delay time as set forth in claim 13, further including:

a second current controlling transistor connected between said electric wire and the ground;

a second switching means connected to a gate of said second current controlling transistor, and operated in response to a second control signal which is enabled when a level of a voltage applied to said capacitor varies, whereas it is disabled to turn off said current controlling transistor when that of the voltage goes constant; and a second reference voltage generator at its output terminal connected to said second switching means, and for varying an amount of an electric current flowing through said second current controlling transistor when a level of a voltage applied to said capacitor is changed, thereby keeping an amount of an electric current flowing through said capacitor constant.

17. A delay circuit having a constant delay time as set forth in claim 16, wherein said second current controlling transistor is provided with a N-channel MOS transistor.

18. A delay circuit having a constant delay time as set forth in claim 16, wherein said second switching means further comprises:

a first N-channel MOS transistor connected between said second reference voltage generator and the gate of said second current controlling transistor, and gated by said second control signal; and a second N-channel MOS transistor connected between said second reference voltage generator and the ground, and gated by an inverted signal of said second control signal.

19. A delay circuit having a constant delay time, comprising:

an inverter for inverting an input signal to generate an output signal;

an electric wire for transmitting said output signal;

a capacitor connected between said electric wire and the ground, and for delaying the transmission of said output signal;

a first current controlling transistor connected to said capacitor in parallel, and connected between said electric wire and the ground;

first switching means connected to a gate of said first current controlling transistor, and for increasing an amount of the electric current flowing through said first current controlling transistor when a voltage applied to said capacitor is increased, thereby causing the amount of the electric current flowing through said capacitor to be kept constant;

a second current controlling transistor connected between said electric wire and a terminal of the source voltage; and second switching means connected to a gate of said second current controlling transistor, and for decreasing an amount of the electric current flowing through said second current controlling transistor when a voltage applied to said capacitor is decreased, thereby causing the amount of the electric current flowing through said capacitor to be kept constant.

20. A delay circuit having a constant delay time as set forth in claim 19, wherein said first current controlling transistor is provided with a N-channel MOS transistor.

21. A delay circuit having a constant delay time as set forth in claim 19, wherein said second current controlling transistor is provided with a P-channel MOS transistor.

* * * * *